United States Patent [19]
Manley

[11] Patent Number: 5,262,028
[45] Date of Patent: Nov. 16, 1993

[54] PLANAR MAGNETRON SPUTTERING MAGNET ASSEMBLY

[75] Inventor: Barry W. Manley, Boulder, Colo.

[73] Assignee: Sierra Applied Sciences, Inc., Boulder, Colo.

[21] Appl. No.: 891,707

[22] Filed: Jun. 1, 1992

[51] Int. Cl.⁵ ............................................. C23C 14/34
[52] U.S. Cl. ........................... 204/192.12; 204/298.16; 204/298.17; 204/298.19
[58] Field of Search .................. 204/192.12, 298.16, 204/298.17, 298.19

[56] References Cited

U.S. PATENT DOCUMENTS

| | | | |
|---|---|---|---|
| 3,878,085 | 4/1975 | Corbani | 204/298 |
| 3,956,093 | 5/1976 | McLeod | 204/192 |
| 4,162,954 | 7/1979 | Morrison, Jr. | 204/298 |
| 4,166,018 | 8/1979 | Chapin | 204/192 R |
| 4,180,450 | 12/1979 | Morrison, Jr. | 204/298 |
| 4,198,283 | 4/1980 | Class et al. | 204/298 |
| 4,239,611 | 12/1980 | Morrison, Jr. | 204/298 |
| 4,265,729 | 5/1981 | Morrison, Jr. | 204/298 |
| 4,282,083 | 8/1981 | Kertesz et al. | 204/298 |
| 4,312,731 | 1/1982 | Morrison, Jr. | 204/192 R |
| 4,356,073 | 10/1982 | McKelvey | 204/192 R |
| 4,404,077 | 9/1983 | Fournier | 204/192 R |
| 4,434,037 | 2/1984 | Crank | 204/192 R |
| 4,444,643 | 4/1984 | Garrett | 204/298 |
| 4,448,653 | 5/1984 | Wegmann | 204/298 |
| 4,461,688 | 7/1984 | Morrison, Jr. | 204/192 R |
| 4,601,806 | 7/1986 | Wirz | 204/298.19 X |
| 4,810,346 | 3/1989 | Wolf et al. | 204/298 |
| 4,872,964 | 10/1989 | Suzuki et al. | 204/298 |
| 4,892,633 | 1/1990 | Welty | 204/192.12 |

Primary Examiner—Nam Nguyen
Attorney, Agent, or Firm—Bruce E. Dahl

[57] ABSTRACT

A sputtering magnet assembly includes a plate-shaped pole piece made from a magnetically permeable material and a central magnet positioned substantially at the center of the pole piece and oriented so that its north-south magnetic orientation is substantially perpendicular to the plate shaped pole piece. A plurality of outer magnets are positioned around the central magnet, each of which has its north-south magnetic orientation also perpendicular to the pole piece, but opposite of the orientation of the central magnet. A plurality of primary inner magnets are arranged around the central magnet, between the central magnet and the outer magnets, each of which primary inner magnets has its north-south magnetic orientation parallel to the base pole piece and perpendicular to the magnetic orientations of the central magnet and the outer magnets. The resulting sputtering magnet assembly produces a magnetic field having magnetic flux lines that define a sputtering region adjacent the front surface of the target and within the target body. The magnetic flux lines form an upper magnetic lobe, a lower magnetic lobe, an inner magnetic lobe, and an outer magnetic lobe, all of which are located substantially within the sputtering region. Further, the strengths and orientations of the magnetic lobes are such that a null point exists between the upper, lower, inner, and outer magnetic lobes.

50 Claims, 12 Drawing Sheets

PLANAR MAGNETRON SPUTTERING MAGNET ASSEMBLY

BACKGROUND OF THE INVENTION

1. Field of the Invention

This invention relates generally to the field of magnetron sputtering and more specifically to planar magnetron sputtering apparatus having improved plasma-confining magnetic fields to increase sputtering efficiency with low aspect ratio targets.

2. Background of the Invention

Glow discharge sputtering is a well-known process and is widely used to deposit thin films of various kinds of ceramic and metallic materials onto the surfaces of objects or substrates. The glow discharge sputtering process is usually conducted in a vacuum chamber and in the presence of a sputtering gas maintained under relatively low pressure. The material to be sputtered and deposited onto the substrate is commonly referred to as the target and is mounted on a cathode inside the vacuum chamber where it is eroded or sputtered by a plasma or glow discharge that is established on the surface of the target material. The cathode and target are held at a strong negative potential, so that positive ions from the glow discharge bombard the target material and eject target atoms, which then condense on the surface of the substrate, forming a thin film or layer of the target material on the substrate. Other particles and radiation are also produced at the target and in the plasma that may also affect the properties of the deposited film.

While the sputtering yield, i.e., the number of target atoms sputtered per incident ion, depends on the energies of the incident ions, the overall sputtering rate depends on both the energies of the incident ions as well as the total number of ions bombarding the target surface during a given time period. Therefore, in order to maximize sputtering efficiency, it is desirable to produce and confine the ions and electrons in the glow discharge as close as possible to the surface of the target material. Towards this end, numerous kinds of magnetron sputtering apparatus, as they have come to be known, have been developed which utilize magnetic fields or "tunnels" to confine the glow discharge in close proximity to the surface of the target.

Most planar magnetron sputtering apparatus generally include plate-like or planar targets along with suitable magnet assemblies for producing plasma-confining magnetic fields adjacent the target. While numerous shapes and configurations of plasma-confining magnetic fields have been developed and used with varying degrees of success, it is common to shape a plasma-confining magnetic field to form a closed loop ring or "racetrack" over the surface of the target material. When viewed in cross section, the flux lines of the magnetic field loop or arch over the surface of the target, forming a magnetic "tunnel," which confines the glow discharge to the ring or racetrack shaped sputtering region. As is well known, an electric field created by a high voltage between an anode and the target/cathode acting in combination with the closed loop magnetic field causes electrons within the glow discharge to gain a net velocity along the racetrack, with the magnitude and direction of the electron velocity vector being given by the vector cross product of the electric field vector $\vec{E}$ and the magnetic field vector $\vec{B}$ (known as the $\vec{E} \times \vec{B}$ velocity). The shape of the predominate electron path defines the portion of the target material that will be sputtered.

Unfortunately, in most conventional magnetron sputtering apparatus having such ring shaped magnetic tunnels, the arched shape of the magnetic field over the target surface tends to force or "pinch" the electrons, thus the predominate electron path, toward the center of the tunnel. This pinching effect causes the plasma density and, therefore, the sputtering erosion, to be highest along the centerline of the tunnel. As the target is gradually eroded, the pinching forces tend to strengthen, causing stronger pinching, ultimately resulting in a V-shaped erosion groove in the target. The fraction of the target material that has been sputtered away by the time the bottom of the V-shaped erosion groove reaches the back surface of the target is referred to as the target utilization. In most prior art sputtering magnetrons, the target utilization is relatively low, in the range of about 20% to 30%. Since the commonly used target materials tend to be relatively expensive, such low target utilization is wasteful and increases the costs associated with the sputtering process. For example, although spent targets may be recycled and reworked into new targets, the time spent changing and reworking targets can be significant and in any event, increases the overall cost of the sputtering operation. Therefore, any significant increase in target utilization translates directly into cost savings, as the increased target utilization enables longer production runs and less downtime spent in reworking and replacing targets.

Over the years, inventors have attempted to increase the target utilization associated with such planar magnetrons by changing the shapes of the plasma-confining magnetic fields. For example, Morrison in U.S. Pat. No. 4,180,450, discloses a planar magnetron wherein the curvature of the convexly arched field lines of the magnetic tunnel are flattened in an attempt to reduce the plasma pinching effect described above. The patent issued to McLeod, U.S. Pat. No. 3,956,093, increases target utilization somewhat by enlarging the sputtering region over the target. McLeod accomplishes the enlargement of the sputtering region by using electromagnets to apply a variable magnetic bias field to the otherwise static magnetic field, thus oscillating the magnetic field over the center of the erosion groove. Other magnetron apparatus increase the erosion area by physically moving the entire magnet assembly or the target during the sputtering process.

While these foregoing prior art devices have improved target utilization to some degree, the improvements have usually come at the expense of decreased power efficiency, or have required the addition of separate or additional electromagnetic coils or the addition of complex apparatus to physically move the magnet structure or target. Besides increasing the overall cost of the sputtering device, the addition of large numbers of components into the sputtering chamber may poison the sputtered film with unwanted impurities if suitable precautions are not taken to insure that the additional components themselves do not sputter.

Welty, in U.S. Pat. No. 4,892,633, discovered another way to increase target utilization without having to resort to complex apparatus to oscillate either the magnetic field or the target, with all their associated disadvantages. Specifically, Welty teaches a method and apparatus for magnetron sputtering in which some of the flux lines forming the closed-loop magnetic tunnel change curvature from convex to slightly concave within the sputtering region. Welty's improved field shape reduces the pinching effect and allows more complete consumption of the target material. Unfortunately, however, the Welty system is not without its drawbacks. For example, the magnetic shunt used by Welty to pull down the magnetic field lines over the surface of the target, thus change their curvatures from convex to slightly concave also substantially weakens the strength of the magnetic field. This weakened magnetic field reduces the maximum allowable target thickness, which, of course, reduces the length of the production runs and increases the downtime spent replacing targets. Alternatively, stronger magnets could be used to compensate for the reduced field strength. Unfortunately, however, most sputtering magnetrons already use the strongest magnets available, so this option is effectively foreclosed.

Therefore, there remains a need for an improved planar magnetron sputtering apparatus that can achieve a substantial increase in target utilization without the need to add separate electromagnets or other complex apparatus to move the magnetic field over the surface of the target, and without the need to move the target itself. Ideally, such a planar magnetron should achieve an increase in target utilization by using a simple static magnetic tunnel field, but without weakening the strength of the magnetic tunnel and without unduly limiting the maximum allowable thickness of the target material. Prior to this invention, no such device existed.

SUMMARY OF THE INVENTION

Accordingly, it is a general object of this invention to provide a magnetron sputtering device having increased target utilization.

It is another general object of this invention to provide an improved magnetron sputtering device that can utilize thicker target materials with reduced aspect ratios.

It is a more specific object of this invention to provide a planar magnetron sputtering apparatus having an improved magnetic field shape to reduce the plasma pinching effect associated with prior art magnetrons.

It is still another more specific object of this invention to provide a planar magnetron sputtering apparatus having an improved magnetic field shape to reduce the plasma pinching effect, but without the need to resort to apparatus to oscillate the magnetic field over the surface of the target or to oscillate the target itself.

To achieve the foregoing and other objects and in accordance with the purpose of the present invention, as embodied and broadly described herein, the improved planar magnetron sputtering magnet assembly of this invention includes a sputtering magnet assembly positioned adjacent the back surface of the target for generating a magnetic field with magnetic flux lines that define a sputtering region adjacent the front surface of the target and within the target body. The magnetic flux lines form an upper magnetic lobe, a lower magnetic lobe, an inner magnetic lobe, and an outer magnetic lobe, all of which are located substantially within the sputtering region. Further, the strengths and orientations of the magnetic lobes are such that a null point exists between the upper, lower, inner, and outer magnetic lobes. During the sputtering operation, the magnetic lobes form respective upper, lower, inner, and outer closed-loop plasma-confining magnetic tunnels as the target material is sputtered away.

A basic embodiment of the sputtering magnet assembly for generating the four separate closed-loop plasma-confining magnetic tunnels includes a plate-shaped pole piece made from a magnetically permeable material. A central magnet is positioned substantially at the center of the pole piece and is oriented so that its north-south magnetic orientation is substantially perpendicular to the plate shaped pole piece. A plurality of outer magnets are positioned around the central magnet, each of which has its north-south magnetic orientation also perpendicular to the pole piece, but opposite of the orientation of the central magnet. A plurality of primary inner magnets are arranged around the central magnet, between the central magnet and the outer magnets, each of which primary inner magnets has its north-south magnetic orientation parallel to the base pole piece and perpendicular to the magnetic orientations of the central magnet and the outer magnets.

The method of this invention includes the steps of establishing a low pressure sputtering atmosphere in a sputtering chamber and creating a glow discharge over a sputtering region on a target located within the sputtering chamber. A magnetic field is then generated that has a plurality of magnetic flux lines adjacent the front surface of the target and within the target body. The magnetic flux lines form an upper magnetic lobe, a lower magnetic lobe, an inner magnetic lobe, and an outer magnetic lobe, all of which are located substantially within the sputtering region and the target body. The strengths and orientations of the magnetic lobes are such that a null point exists between the upper, lower, inner, and outer magnetic lobes.

Additional objects, advantages, and novel features of the invention shall be set forth in part in the description that follows, and in part will become apparent to those skilled in the art upon examination of the following or may be learned by the practice of the invention. The objects and the advantages of the invention may be realized and attained by means of the instrumentalities and in combinations particularly pointed out in the appended claims.

BRIEF DESCRIPTION OF THE DRAWINGS

The accompanying drawings, which are incorporated herein and form a part of the specification illustrate preferred embodiments of the present invention, and together with the description, serve to explain the principles of the invention. In the drawings.

DETAILED DESCRIPTION OF THE PREFERRED EMBODIMENT

The improved planar magnetron sputtering magnet assembly according to the present invention may take on different configurations depending on the particular target shape and the desired erosion pattern, as will be explained in detail below, and may be used with targets in the form of flat circular or rectangular plates. For example, round or circular magnetron for eroding a circular target plate will have the plasma-confining magnetic tunnels in the shape of concentric circular rings, whereas the shape of each magnetic tunnel for a rectangular target will include two linear sections in parallel, spaced apart relation extending along most of the length of the rectangular target and joined at each end by a semicircular section to form a continuous loop in the shape of a flattened oval or "racetrack." Accordingly, the improved magnetron sputtering magnet assembly according to the present invention is shown and described herein as it could be configured for use with targets having either round or rectangular platforms. Finally, since the details of the other components required to construct and operate a planar magnetron sputtering apparatus, such as the vacuum chamber, apparatus for mounting and cooling the target, and apparatus for electrically connecting the target cathode to the voltage source, etc., are well known to persons having ordinary skill in the art, such other components are not shown and described herein. Moreover, persons skilled in the art would also recognize the need to surround the magnet assembly with a suitable ground shield to prevent unwanted sputtering of the magnet assembly and to prevent arcing. Therefore, such ground shielding is also not shown and described herein.

Figure 1:
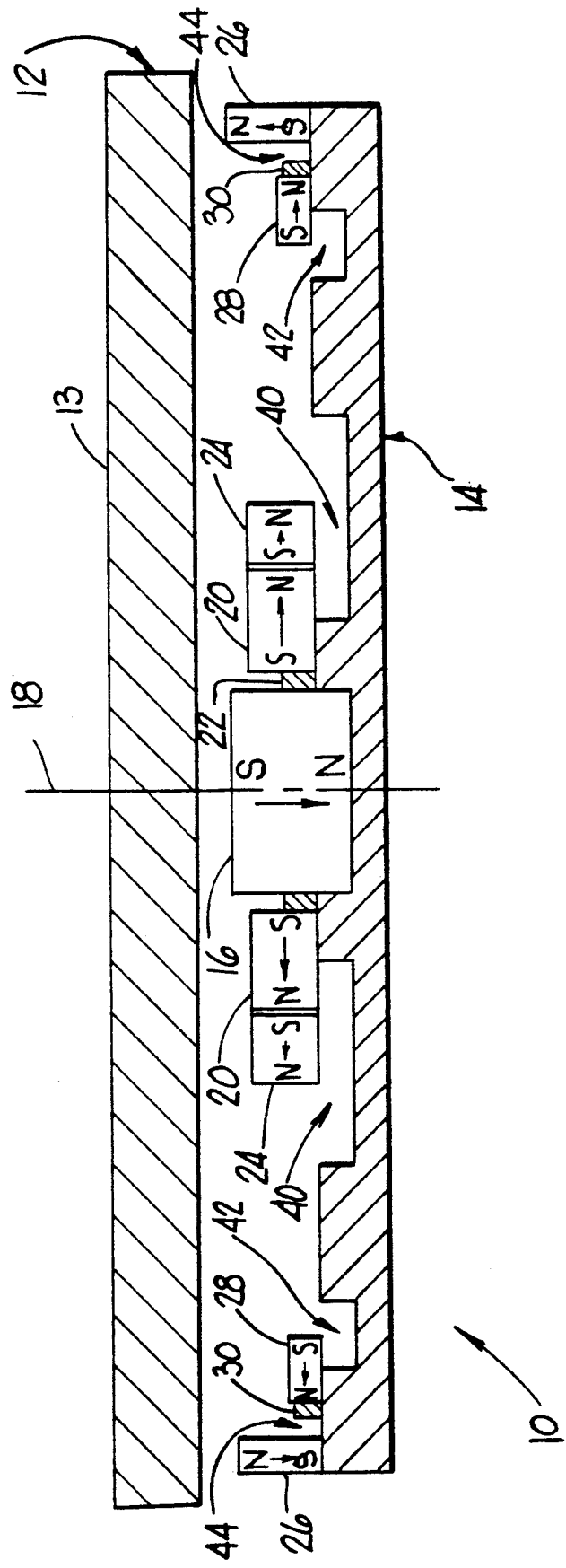
FIG. 1 is a schematic cross section view in elevation of a first embodiment of the improved planar magnetron sputtering magnet assembly according to the present invention taken along the lines 1—1 of FIG. 2, showing the position of the target with respect to the magnet assembly and the arrangements and north-south field orientations of the permanent magnets.
Figure 2:
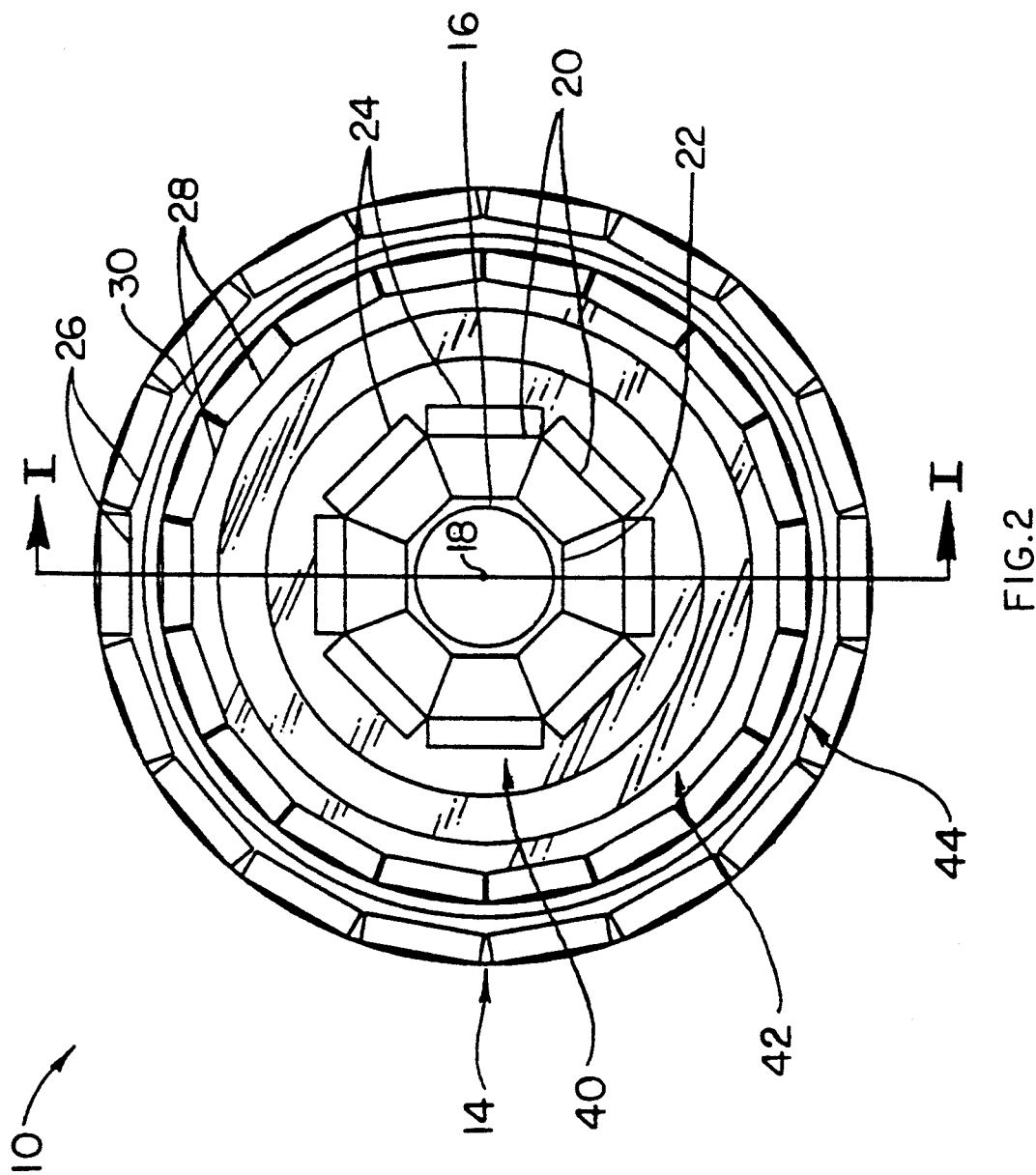
FIG. 2 is a plan view of the round planar magnetron sputtering magnet assembly shown in FIG. 1.
Figure 3:
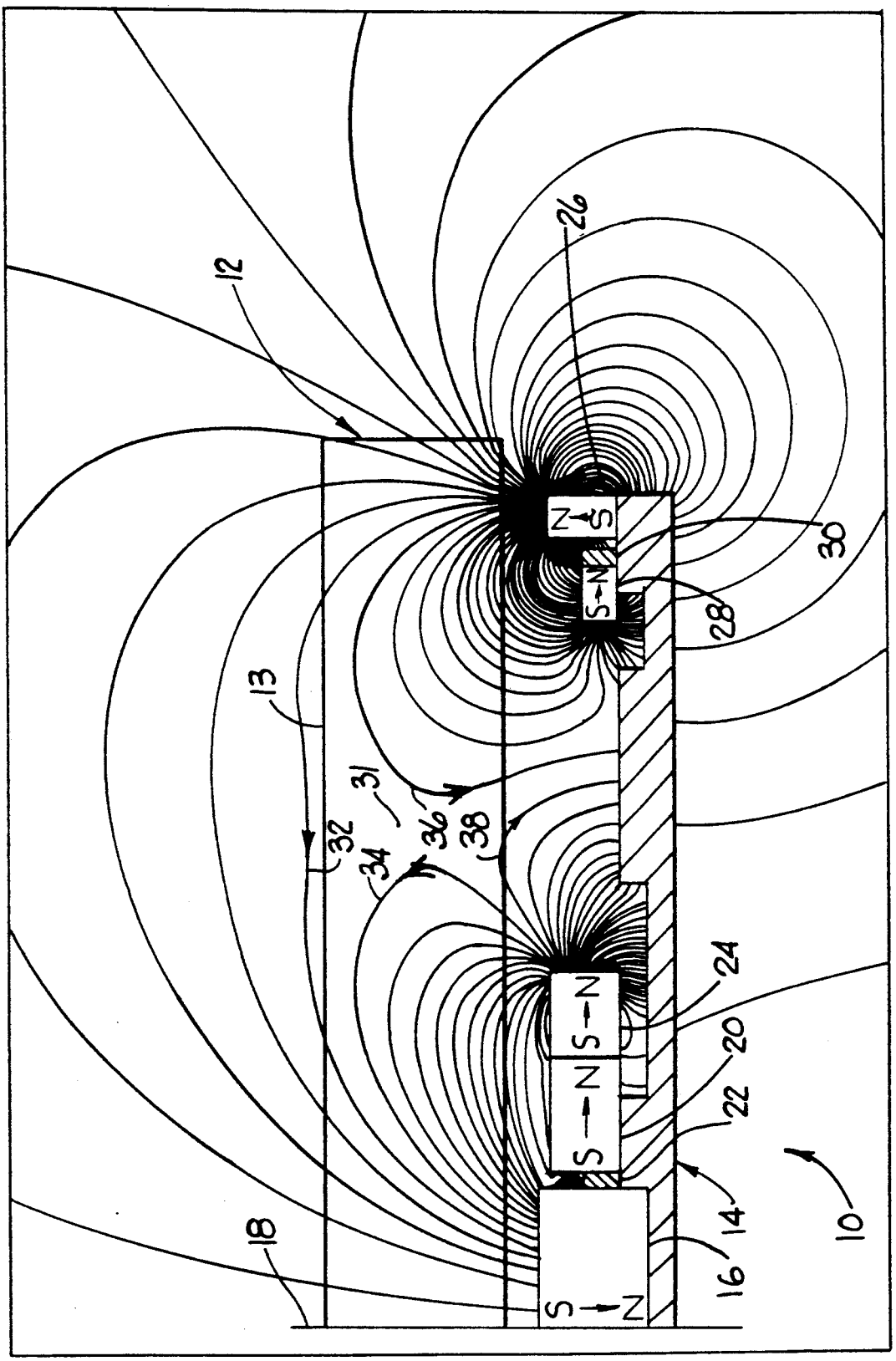
FIG. 3 is a schematic cross section view in elevation of the first embodiment of the improved planar magnetron sputtering magnet assembly shown in FIG. 1, but showing the orientation and shape of the magnetic flux lines of the four lobed magnetic field with respect to the target.

Briefly, the preferred embodiment 10 of the improved planar magnetron sputtering magnet assembly according to the present invention is best seen in FIGS. 1-3 as it is configured to generate four concentric circular closed loop magnetic tunnels over the front surface 13 of a flat circular target 12 positioned above the sputtering magnet assembly 10. Essentially, sputtering magnet assembly 10 comprises a base pole piece 14 to which are mounted a plurality of permanent magnets having their north-south magnetic orientations arranged in various horizontal and vertical configuration, as best seen in FIG. 1. Together, the magnets and base pole piece 14, which form the magnet assembly 10, produce a unique, four lobed magnetic field, with each of the four lobes 32, 34, 36, and 38 essentially defining the sputtering region, as best seen in FIG. 3. During the actual sputtering process, each of the magnetic lobes 32, 34, 36, and 38 forms a separate closed-loop plasma-confining magnetic tunnel, with each tunnel having a more pronounced effect on the plasma as the target material gradually erodes away, thus exposing more of the magnetic flux lines associated with each individual lobe. As will be described in greater detail below, this four lobed plasma-confining magnetic field configuration, and the arrangement of the magnets for producing the same, are significant features of the invention and allow the density of glow discharge to remain substantially uniform as it erodes away the target material 12. This increased uniformity of the glow discharge in the sputtering region significantly increases the target utilization of the present invention.

Another significant feature of this invention is that it does not require magnetic field-weakening shunts to shape the magnetic field and improve the uniformity of the glow discharge. The sputtering magnet assembly according to the present invention, therefore, can be used with relatively thick targets 12 having aspect ratios, i.e., diameter to thickness ratios, of around 9:1 or less, as opposed to aspect ratios of about 15:1 for prior art devices with similar target utilizations. The reduced target aspect ratio allows thicker targets to be sputtered, thus increasing the production run with a given target and reducing the downtime associated with target recycling and target replacement. Furthermore, since the present invention uses simple static magnetic fields to produce the increased target utilization, it does not require complex apparatus to move the magnetic field with respect to the target, with all its associated disadvantages. Consequently, the entire sputtering magnet assembly according to the present invention may be coated with an inert insulating material, such as epoxy, to prevent the sputtering magnet assembly from being corroded if it is immersed in water or some other coolant.

The details of the preferred embodiment 10 of the improved planar magnetron sputtering magnet assembly of this invention are best seen in FIGS. 1, 2, and 3. Since the magnet assembly 10 is specifically configured to generate a circular magnetic field for sputtering plate-like targets having circular planforms, it comprises a plurality of individual magnets arranged in a circular manner, concentric with the axis of symmetry 18 of the circular base pole piece 14, as best seen in FIG. 2. Referring now to FIGS. 1 and 2 simultaneously, magnet assembly 10 comprises a base pole piece 14 having a circular planform and constructed from a magnetically permeable material, such as iron or nickel, and which includes an integral central or inner base gap 40 and an outer base gap 42, which gaps enhance the shape of the four lobed magnetic field, as will be described in detail below. A single, cylindrically shaped, central magnet 16 is mounted to the center of base pole piece 14, concentric with axis of symmetry 18, and is oriented so that the north pole N is immediately adjacent pole piece 14, as seen in FIG. 1. A plurality of primary inner horizontal magnets 20 are arranged around central magnet 16, also concentric with axis 18, and separated from central magnet 16 by a ring shaped central or inner pole piece 22, as best seen in FIG. 2. As will be described in more detail below, a plurality of secondary inner horizontal magnets 24 may be optionally mounted to the primary inner horizontal magnets 20 to increase the strength of the magnetic field and slightly modify its shape, as may be required for targets having larger diameters. Finally, a plurality of outer vertical magnets 26 are mounted to the outer periphery of base pole piece 14 and are separated from the secondary inner magnets 24 by a plurality of outer horizontal magnets 28, ring shaped outer pole piece 30, and by outer vertical gap 44.

In the preferred embodiment, the magnets 16, 20, 22, 24, 26, and 28 are rare earth Neodymium Iron Boron (NdFeB) magnets having magnetic field energy products greater than about 35 megagauss-oersteds (MGOe). However, other types of rare earth magnets, such as Samarium Cobolt (SmCo) magnets, may be substituted with equal effectiveness. Good results have also been obtained by substituting the outer horizontal magnets 28 with ceramic magnets, such as barium or strontium ferrite magnets, having magnetic field energy products of about 3.5 MGOe.

The particular arrangement of the magnets 16, 20, 22, 24, 26, and 28, ring shaped pole pieces 22 and 30, as well as gaps 40, 42, and 44 of the improved sputtering magnet assembly 10 shown in FIGS. 1 and 2 produces a four lobed magnetic field having magnetic flux lines substantially as shown in FIG. 3. The illustration of the magnetic flux lines shown in both FIGS. 3 and 7 herein was generated by a finite element computer modeling program of the kind that are readily commercially available and well-known to persons having ordinary skill in the art. The spacing between the flux lines is proportional to the magnetic flux density, i.e., field strength. The closer the line spacing, the stronger the magnetic field. Note that the flux lines inside the magnets themselves and the magnetically permeable pole pieces are not shown for clarity.

Figure 4:
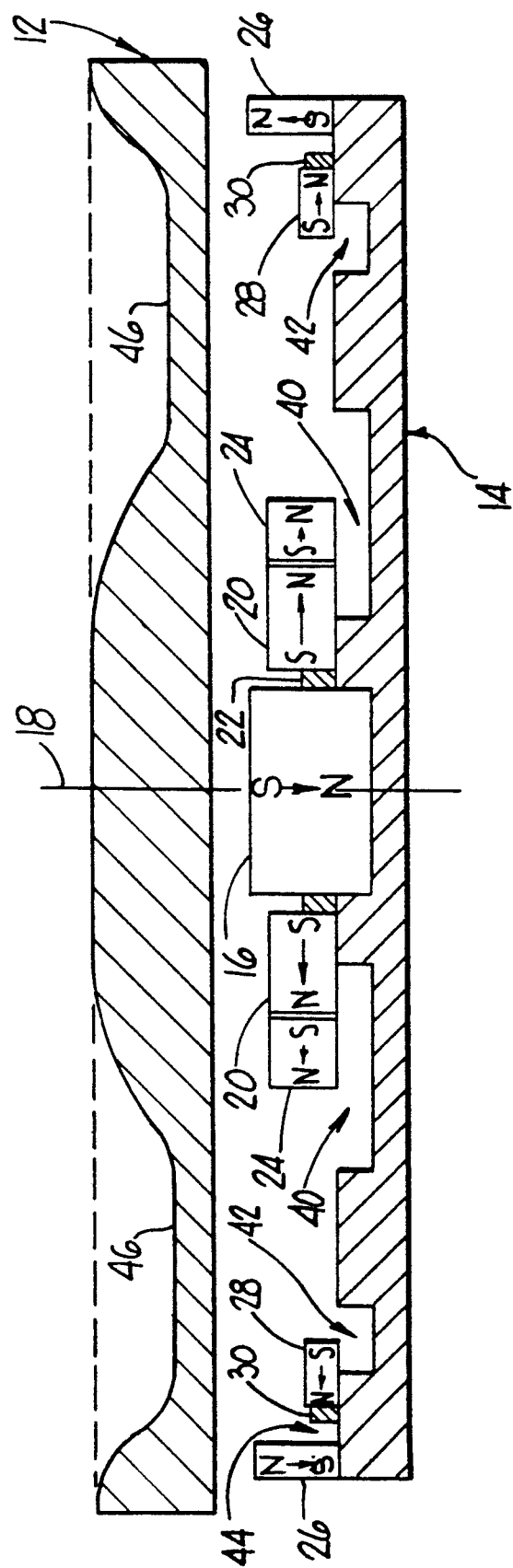
FIG. 4 is a schematic cross section view in elevation of the first embodiment of the improved planar magnetron sputtering magnet assembly shown FIGS. 1 and 3, showing a typical erosion groove that is eroded in the target.

Referring back now to FIG. 3, the magnetic field created by the magnet assembly 10 is characterized by the existence of four individual lobes, an upper lobe 32, an inner lobe 34, an outer lobe 36, and a lower lobe 38 located about or within the target material 12. As was mentioned above, each individual lobe 32, 34, 36, and 38 forms a separate closed-loop plasma-confining magnetic tunnel during the actual sputtering process. Therefore, the four lobes 32, 34, 36, and 38 substantially define the sputtering region, that is, the volume within which the target is sputtered. Another interesting feature of the four lobed magnetic field is that there exists a null point 31 within the sputtering region bounded by the four lobes 32, 34, 36, and 38. The null point 31 is that point in space where the sum of the magnetic flux density is zero. For the embodiment shown in FIG. 1, the null point 31 is approximately equidistant from the inflection points of each of the magnetic lobes, as best seen in FIG. 3. It should be noted that the existence of the null point 31, in and of itself, is not necessary to achieve the objects of the present invention. Rather, the existence of null point 31 is a direct result of the four magnetic lobes 32, 34, 36, and 38, which lobes are necessary to achieve the objects of the present invention. Null point 31 thus serves as alternative way to define the four magnetic lobes 32, 34, 36, and 38, and in particular the strengths and orientations of those lobes. Put in other words, the strengths and orientations of the respective magnetic lobes 32, 34, 36, and 38 are such that the net magnetic flux density is zero at null point 31. Essentially, the three lobes 34, 36, and 38 confine the electrons in the glow discharge near the surface 13 of the target 12 in a way similar to the single closed loop magnetic tunnels known in the prior art. Advantageously, however, because each lobe 34, 36, and 38 forms an individual closed loop magnetic tunnel, the resulting glow discharge density just above the front surface 13 of the target is dispersed far more evenly than is possible with a conventional single loop magnetic tunnel. Consequently, the sputtering erosion rate is more evenly dispersed over the target surface 13 and results in the very wide and flat erosion groove 46 shown in FIG. 4. This erosion groove 46 obtainable with this invention is substantially wider and flatter than the erosion grooves associated with most prior art planar magnetrons and corresponds to a target utilization in the range of about 50% for a 15.9 mm (0.625in) thick target, compared to a target utilization of only about 25% for the same thickness target when sputtered by a typical prior art planar magnetron.

Figure 5:
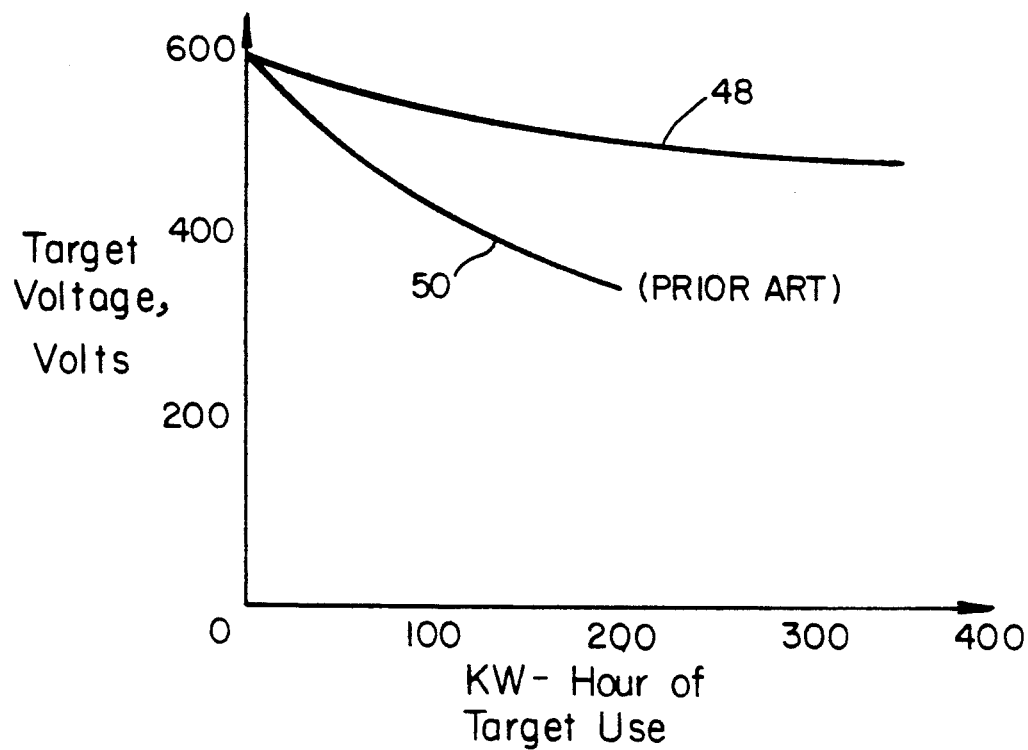
FIG. 5 is a plot comparing the target voltage vs. target usage of the improved planar magnetron sputtering magnet assembly according to this invention with that of a typical prior art planar magnetron.

As a result of the increased uniformity of the glow discharge, the electrical impedance of the sputtering process is considerably more stable throughout the life of the target 12, resulting in more predictable and uniform coating of the substrate (not shown). Put in other words, the target voltage required to achieve a uniform sputtering rate over the life of the target 12, represented by curve 48 in FIG. 5, is substantially flatter than is possible with a typical prior art planar magnetron, indicated by curve 50. Further, the increased target utilization results in a significant increase in target life, expressed as kilowatt-hours, as also seen in FIG. 5.

As was briefly discussed above, the overall shape of the magnetic field, as well as the shapes of each of the individual lobes 32, 34, 36, and 38 of the field can be modified by changing the configurations and spacings between the magnets and by adding, eliminating, or changing the shapes of the gaps 40, 42, and 44. For example, the inner base gap 40 and the primary and secondary inner horizontal magnets 20 and 24, respectively, create upper lobe 32, inner lower lobe 34, and middle lower lobe 38 of the magnetic field. The existence of the inner lobe 34 is critical to the performance of the magnet assembly according to this invention, because it moves and confines the electrons in the glow discharge near the inner portion of the erosion groove 46 (FIG. 3), and is thus primarily responsible for the increase in the target utilization. Similarly, the outer base gap 42, outer horizontal magnets 28, and ring shaped outer pole piece 30 primarily affect the shape and location of the outer lobe 36, which lobe 36 helps to move and confine the electrons in the glow discharge towards the outer portion of the erosion groove 46.

Figure 6:
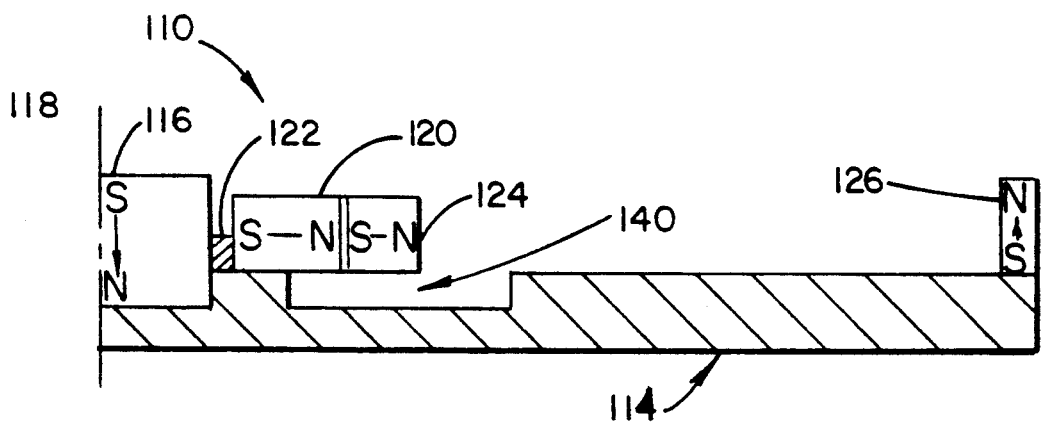
FIG. 6 is a schematic cross section view in elevation of a second embodiment of the improved planar magnetron sputtering assembly according to the present invention.
Figure 7:
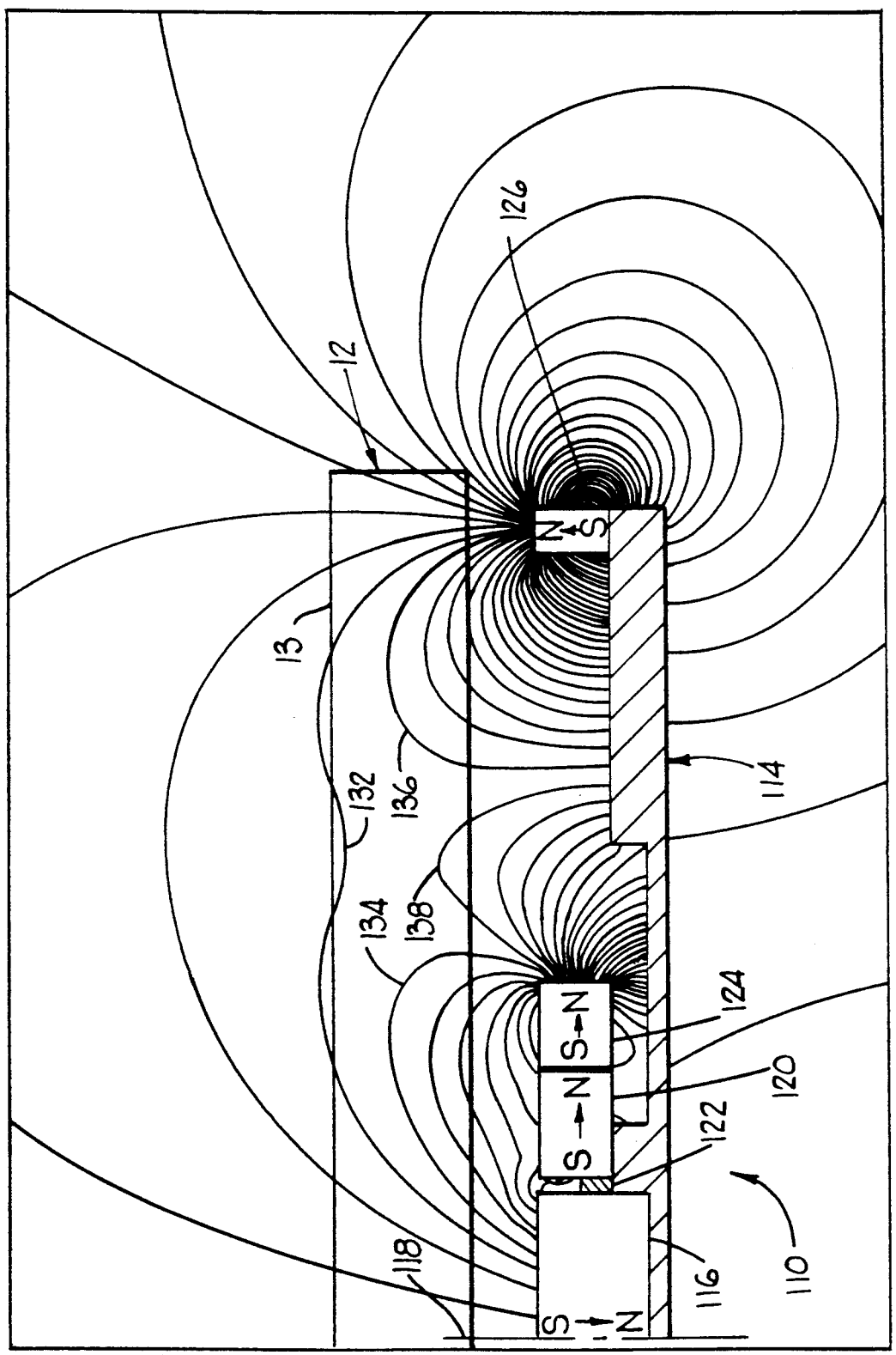
FIG. 7 is a schematic cross section view in elevation of the second embodiment of the improved planar magnetron sputtering magnet assembly shown FIG. 6, showing the corresponding orientation and shape of the magnetic flux lines of the four lobed magnetic field with respect to the target.

The shapes and locations of the lobes 32, 34, 36, and 38 can also be changed by varying the combinations and locations of the optional magnets, i.e., the secondary inner horizontal magnets 24 and the outer horizontal magnets 28. For example, a second embodiment 110 of the sputtering magnet assembly can be constructed by removing the outer horizontal magnets 28, ring shaped pole piece 30, and the outer base gap 42, as shown in FIG. 6. Essentially, then, this second embodiment of the magnet assembly comprises a base pole piece 114 for holding a cylindrically shaped central magnet 116. Primary and secondary inner horizontal magnets 120 and 124, respectively, are mounted around central magnet 116, concentric with axis 118 and separated from central magnet 116 by ring shaped inner pole piece 122. A central base gap 140, located just under the primary and secondary inner horizontal magnets 120 and 124 enhances the shapes of the upper lobe 132, inner middle lobe 134, and middle lower lobe 138, as best seen in FIG. 7. The elimination of the outer horizontal magnets 28 and outer base gap 42 primarily changes the shape and location of the outer lobe 136, although also affecting the shapes and locations of the other lobes 132, 134, and 138 to a lesser degree.

Figure 8:
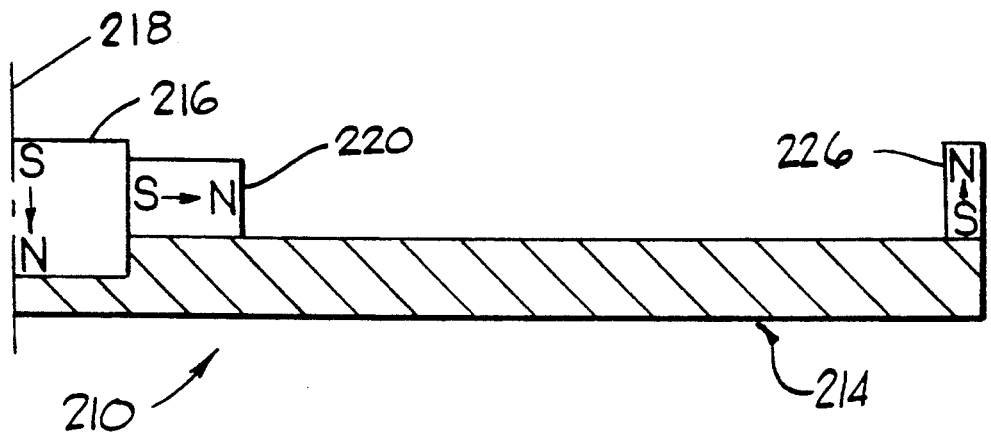
FIG. 8 is a schematic cross section view in elevation of a third embodiment of the improved planar magnetron sputtering assembly.

Still other embodiments are possible. For example, a third embodiment 210 of the magnet assembly is shown in FIG. 8. This third embodiment 210 represents the simplest embodiment of the present invention and comprises only a pole piece 214, a central magnet 216, a plurality of primary inner horizontal magnets 220 arranged around central magnet 216 (but without ring shaped pole piece 22), and a plurality of outer vertical magnets 226. This magnet assembly 210 still produces a four lobed magnetic field structure, but it is not optimized to provide maximum target utilization with most target configurations. The primary advantage with this third embodiment 210 is its simplicity.

Figure 9:
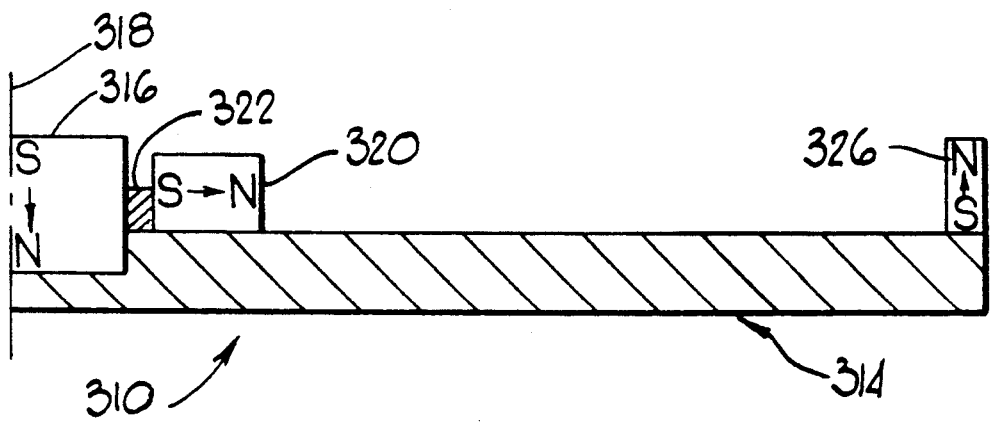
FIG. 9 is a schematic cross section view in elevation of a fourth embodiment of the improved planar magnetron sputtering assembly.
Figure 10:
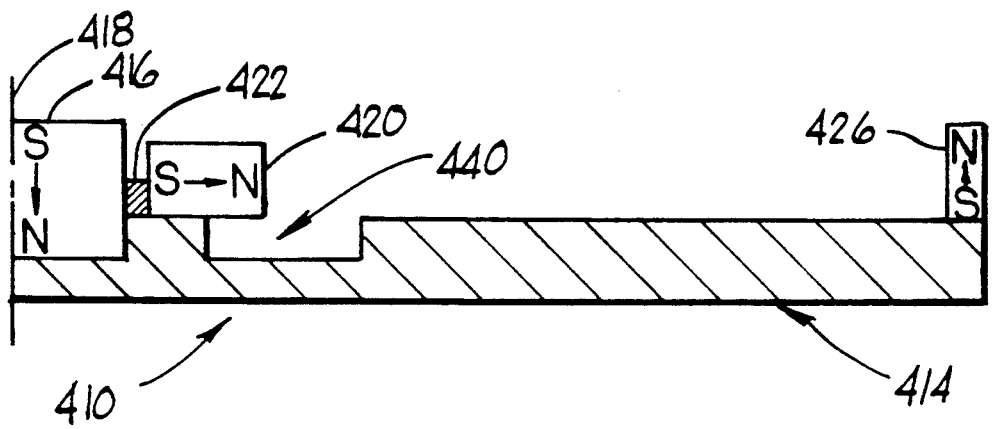
FIG. 10 is a schematic cross section view in elevation of a fifth embodiment of the improved planar magnetron sputtering assembly.

To increase the magnetic stability of the central magnet and the primary inner horizontal magnets, a fourth embodiment 310, shown in FIG. 9, includes a ring shaped inner pole piece 322 sandwiched between the south poles of the primary inner horizontal magnets 320 and central magnet 316. Actually, the main purpose of all the pole pieces used in the various embodiments is to increase the magnetic stabilities of the various magnets and prevent them from being demagnetized by each other and by the high temperature sputtering environment. This forth embodiment still utilizes the outer vertical magnets 326, but does not have any gaps in the base pole piece 314. The fifth embodiment 410 of the magnet assembly according to the present invention is shown in FIG. 10, and increases target utilization by adding an inner base gap 440 extending under the primary inner horizontal magnets 410.

Figure 11:
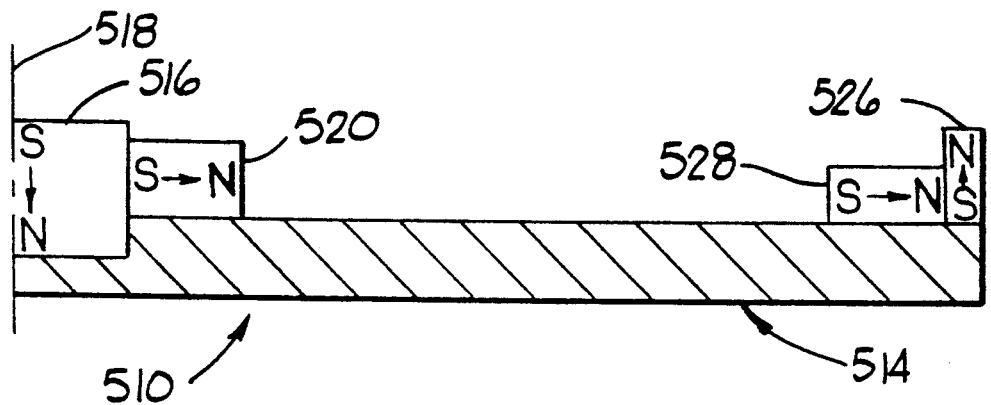
FIG. 11 is a schematic cross section view in elevation of a sixth embodiment of the improved planar magnetron sputtering assembly.
Figure 12:
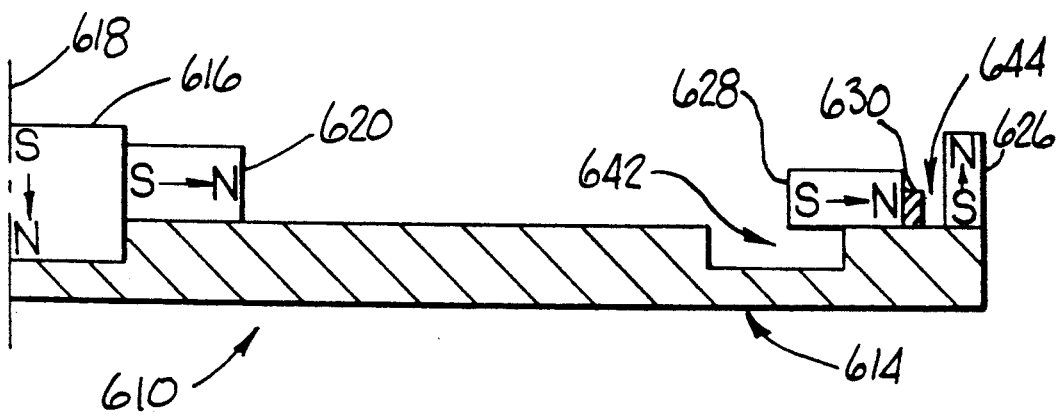
FIG. 12 is a schematic cross section view in elevation of a seventh embodiment of the improved planar magnetron sputtering assembly.

Finally, sixth and seventh embodiments 510 and 610 are shown in FIGS. 11 and 12, respectively, which also modify the four lobed magnetic field to increase target utilization by enhancing the shape of the outer lower lobe 36 to help confine electrons to the outer periphery of the erosion groove 46 (FIG. 3). Essentially, the sixth embodiment 510 adds a plurality of outer horizontal magnets 528 to the embodiment shown in FIG. 8. The seventh embodiment 610 shown in FIG. 12 modifies the embodiment shown in FIG. 11 somewhat by including a ring shaped outer pole piece 630 and gap 644 between the outer vertical magnets 626 and the outer horizontal magnets 628 and also including an outer base gap 642 that extends under the outer horizontal magnets 628. As a result, the configuration of this seventh embodiment 610 shown in FIG. 12 further enhances the shape of outer lobe 36 over the embodiment 510 shown in FIG. 11 to further increase target utilization.

The sputtering magnet assembly according to this invention can also be configured for use with rectangular, as opposed to circular, targets. As was briefly described above, the shape of each magnetic tunnel for a rectangular target includes two linear sections in parallel, spaced apart relation extending along most of the length of the rectangular target and joined at each end by a semicircular section to form a continuous magnetic loop in the shape of a flattened oval or racetrack. As was the case for the circular magnetron, there are four separate plasma-confining magnetic tunnels for the rectangular magnetron, since it also has a four lobed magnetic field.

Figure 13:
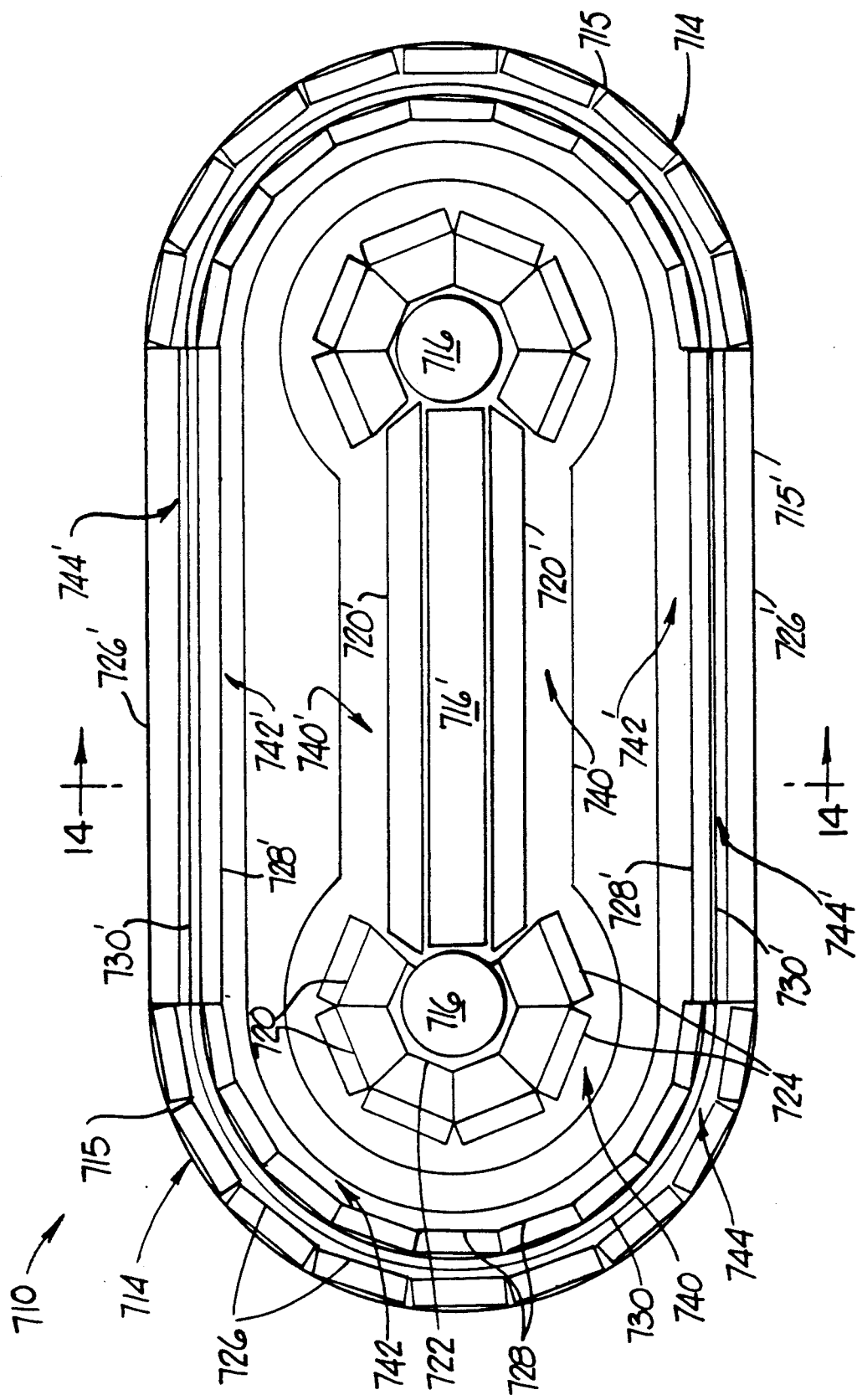
FIG. 13 is a plan view of the rectangular planar magnetron sputtering magnet assembly according to the present invention.
Figure 14:
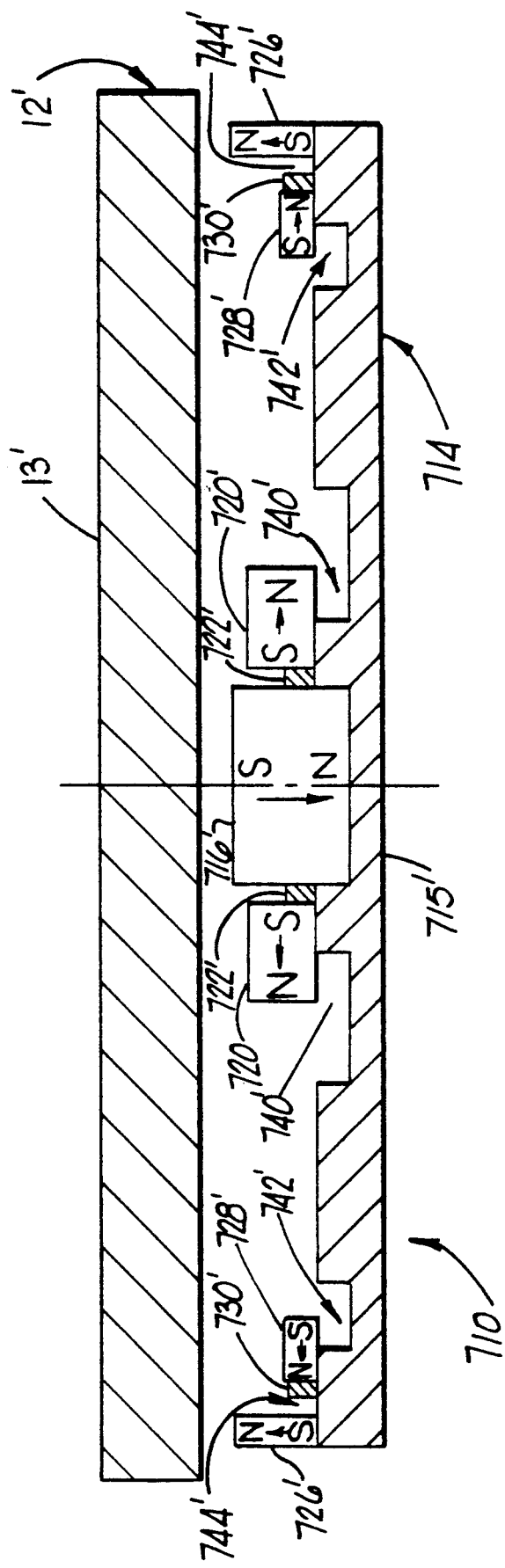
FIG. 14 is a schematic cross section view in elevation taken along the lines 14—14 of FIG. 13, showing the position of the target with respect to the elongated center section of the magnet assembly and the arrangements and north-south field orientations of the permanent magnets.

The sputtering magnet assembly 710 for use with rectangular targets is best seen by referring to FIGS. 13 and 14 simultaneously. Essentially, the sputtering magnet assembly 710 comprises a flattened oval shaped base pole piece 714 for supporting the semi-circular and linear magnet structures which generate the racetrack shaped four lobed magnetic field. More specifically, the configuration of each semi-circular end section 715 of base pole piece 714 is identical to the configuration of the first embodiment 10 shown in FIG. 1 and includes a cylindrical central magnet 716 surrounded by a semi-circular pole piece 722 and a plurality of primary and secondary inner horizontal magnets 720, 724, respectively. A plurality of outer vertical magnets 726 are disposed at the periphery of each semi-circular end section 715 of base pole piece 714. A plurality of outer horizontal magnets 728 are disposed between the secondary inner horizontal magnets 724 and outer vertical magnets 726 and are separated from outer vertical magnets 726 by a pole piece 730 and outer gap 744. A inner base gap 740 extends under the primary and secondary inner horizontal magnets 720 and 724, and an outer base gap 742 extends under the outer horizontal magnets 728.

The configuration of the elongated rectangular center section 715′ separating the two semi-circular end sections 715 is analogous to the configuration of each semi-circular end section, with the only difference being that the magnets, pole pieces and gaps in the center section are arranged in a linear configuration, as opposed to a circular configuration. Referring now to FIG. 14, the center section 715′ includes an elongated central magnet 716′ extending between each cylindrical central magnet 716 in the semi-circular end sections 715 of base pole piece 714. Two elongated primary horizontal magnets 720′ are disposed on either side of central magnet 716' and are separated therefrom by elongated inner pole pieces 722'. Two outer vertical magnets 726' are disposed on opposite sides of center section 715' and are separated from each respective primary horizontal magnet 720 by respective outer horizontal magnets 728' and outer pole pieces 730'. As was the case for the circular magnetrons, an inner base gap 740' extends under each primary horizontal magnet 720' and joins the inner base gaps 740 in each semi-circular end section 714. Similarly, two outer base gaps 742' extend under each respective outer horizontal magnet 728' and join the outer base gaps 742 in each semi-circular end section 714.

Essentially, then, elongated center section 714' "stretches out" the magnetic field between the two semi-circular end sections 714 to form the closed four lobed magnetic racetrack having substantially identical cross-sections at all points along the racetrack. As was the case for the circular magnetrons described above, the cross section of the racetrack shaped magnetic field includes four lobes to increase the uniformity of the glow discharge, thus the target utilization.

As was also the case for the circular magnetrons, the rectangular or racetrack magnetron according to the present invention can be configured in numerous different ways to optimize the four lobes of the magnetic field to the particular target and sputtering conditions desired.

Figure 15:
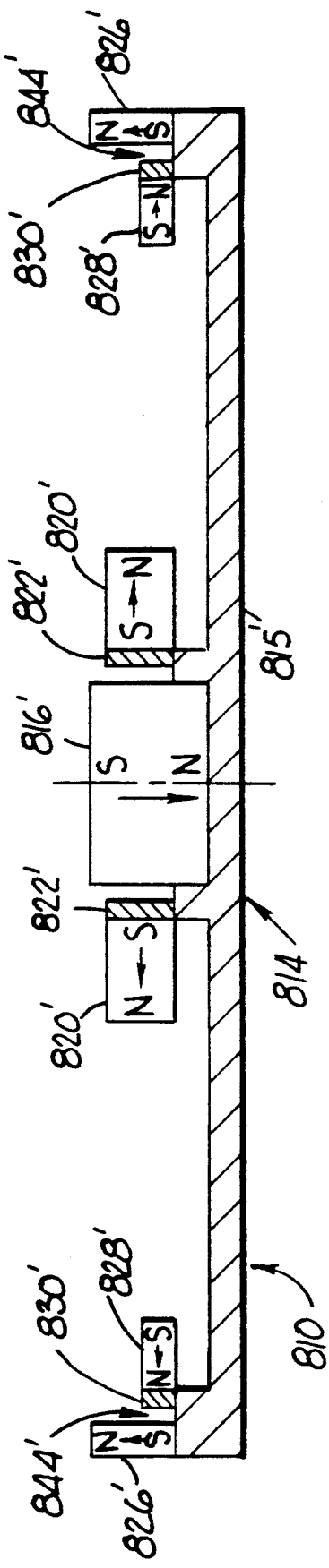
FIG. 15 is a schematic cross section view in elevation of a second embodiment of the improved rectangular planar magnetron sputtering assembly.
Figure 16:
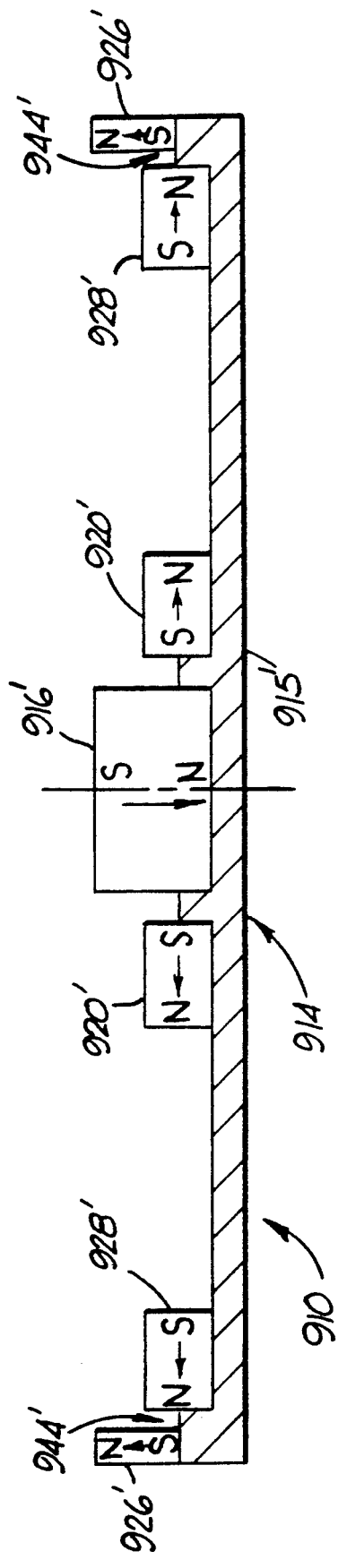
FIG. 16 is a schematic cross section view in elevation of a third embodiment of the improved rectangular planar magnetron sputtering assembly.

For example, a second embodiment 810 of the rectangular sputtering apparatus according to the present invention is shown in FIG. 15. This embodiment 810 is similar to the first embodiment 710, except that the gaps 840' extend from underneath the primary inner magnets 820' all the way to the outer horizontal magnets 828'. As was the case for the circular magnetrons, this configuration of the gaps 840' changes the positions of the four lobed magnetic field, as may be required to optimize the sputtering rate for a given target. A third embodiment 910 is substantially similar to the second embodiment 810, except that the pole pieces for magnets 920' and 928' are now an integral part of the base pole piece 914.

Figure 17:
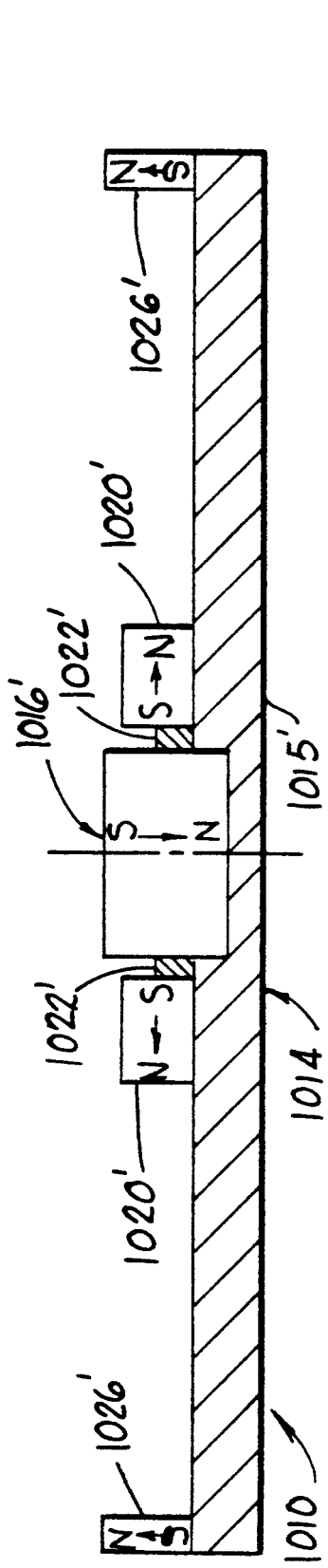
FIG. 17 is a schematic cross section view in elevation of a fourth embodiment of the improved rectangular planar magnetron sputtering assembly.
Figure 18:
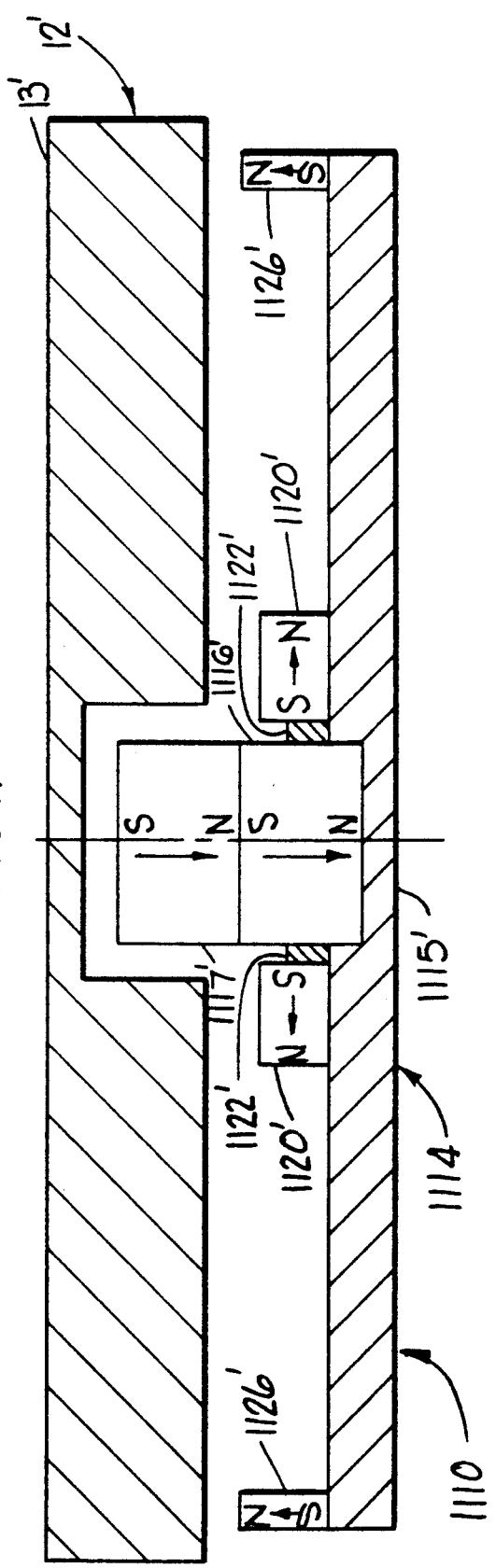
FIG. 18 is a schematic cross section view in elevation of a fifth embodiment of the improved rectangular planar magnetron sputtering assembly according to the present invention, showing the arrangement of a central booster magnet and target.

A fourth embodiment 1010 of the rectangular magnetron is shown in FIG. 17 does not have the outer horizontal magnets thus simplifying construction of the magnet assembly. This fourth embodiment 1010 may be modified by adding a booster central magnet 1117' positioned on top of central magnet 1116' to create the fifth embodiment 1110 shown in FIG. 18. This booster magnet 1117' increases the strength of the magnetic field to allow an even thicker target 12' to be used. Preferably, the center section of thicker target 12' should be cut away to allow clearance for the booster magnet 1117' and to allow the upper surface 13' of target 12' to be positioned more closely to the magnetic field.

This concludes the detailed descriptions of the various embodiments and special configurations of the circular and rectangular planar magnetron sputtering apparatus of the present invention. Note that numerous arrangements of the components of the planar magnetron sputtering apparatus according to this invention are possible, and many other arrangements that are not shown and described herein are possible and would be obvious to those persons having ordinary skill in the art after becoming familiar with the details of this invention and after realizing that the main purpose of the sputtering magnet assembly is to produce the four lobed magnetic field. For example, while the magnets in the embodiments shown and described herein all have north-south magnetic orientations as indicated by the N-S arrows, the notation indicating the magnetic field orientation is arbitrary, and the magnets for a given embodiment could be arranged so that they have opposite orientations, i.e., north and south poles interchanged, as would be obvious to persons having ordinary skill in the art. Also, various different embodiments have been shown for the circular and rectangular magnetrons, but the embodiments shown for each version could be used for the other version. That is, the configuration of a given embodiment for a circular planar magnetron could be easily used in a rectangular planar magnetron and vice versa.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalents may be resorted to falling within the scope of the invention as defined by the claims which follow.

The embodiments of the invention in which an exclusive property or privilege is claimed are defined as follows:

1. A magnetron sputtering cathode for sputtering a target, the target having a front surface, a body, and a back surface, comprising:
   a generally plate-shaped pole piece defining a plane and comprising a magnetically permeable material;
   a first magnet positioned on said pole piece and having a north-south magnetic orientation that is substantially perpendicular to said plane;
   a second magnet positioned on said pole piece a spaced distance from said first magnet and having a north-south magnetic orientation that is substantially perpendicular to said plane and substantially opposite the magnetic orientation of said first magnet; and
   a third magnet positioned on said pole piece between said first magnet and said second magnet, but closely adjacent said first magnet and a substantial spaced distance from said second magnet and having a north-south magnetic orientation that is substantially parallel to said plane and substantially perpendicular to said north-south magnetic orientations of said first magnet and said second magnet, said first, second, and third magnets being spaced to produce a magnetic field having a plurality of magnetic flux lines that define a sputtering region adjacent the front surface of the target and within the target body, the magnetic flux lines forming an upper magnetic lobe, a lower magnetic lobe, an inner magnetic lobe, and an outer magnetic lobe, all of which magnetic lobes are located substantially within said sputtering region and which have strengths and orientations such that a null point exists between said upper, lower, inner, and outer magnetic lobes, whereby each of said magnetic field lobes forms a separate plasma-confining magnetic tunnel.

2. The magnetron sputtering cathode of claim 1, including a fourth magnet positioned on said pole piece between said second magnet and said third magnet, but closely adjacent said second magnet and a substantial spaced distance from said third magnet and having a north-south magnetic orientation that is substantially parallel to said plane and substantially perpendicular to said north-south magnetic orientations of said first magnet and said second magnet.

3. The magnetron sputtering cathode of claim 2, including a fifth magnet positioned on said pole piece between said third magnet and said fourth magnet, but closely adjacent said third magnet and a substantial spaced distance from said fourth magnet and having a north-south magnetic orientation that is substantially parallel to said plane and substantially perpendicular to said north-south magnetic orientations of said first magnet and said second magnet.

4. The magnetron sputtering cathode of claim 3, including a first pole piece disposed between said first magnet and said third magnet.

5. The magnetron sputtering cathode of claim 4, including a second pole piece disposed between said fourth magnet and said second magnet.

6. The magnetron sputtering cathode of claim 5, wherein said first pole piece includes a first gap located under said third magnet and extending partway toward said fourth magnet.

7. The magnetron sputtering cathode of claim 6, wherein said second pole piece includes a second gap located under said fourth magnet and extending partway toward said third magnet, but not extending to said first gap.

8. The magnetron sputtering cathode of claim 7, including a sixth magnet positioned on said first magnet and having a north-south magnetic orientation that is substantially perpendicular to said plane and substantially aligned with the magnetic orientation of said first magnet.

9. A method of glow discharge sputtering, comprising the steps of:
  establishing a low pressure sputtering atmosphere in a sputtering chamber;
  creating a glow discharge over a sputtering region on a target located within the sputtering chamber, the target having a front surface, a body, and a back surface; and
  generating a magnetic field having a plurality of magnetic flux lines adjacent the front surface of the target and within the target body, the magnetic flux lines forming an upper magnetic lobe, a lower magnetic lobe, an inner magnetic lobe, and an outer magnetic lobe, all of which magnetic lobes are located substantially within said sputtering region and the target body and which have strengths and orientations such that a null point exists between said upper, lower, inner, and outer magnetic lobes, whereby each of said lobes creates a glow discharge-confining magnetic tunnel.

10. A magnet assembly for sputtering a target in a planar magnetron sputtering apparatus, the target having a front surface, a body, and a back surface, said magnet assembly being positioned adjacent the back surface of the target and generating a magnetic field having a plurality of magnetic flux lines that define a sputtering region adjacent the front surface of the target and within the target body, the magnetic flux lines forming an upper magnetic lobe, a lower magnetic lobe, an inner magnetic lobe, and an outer magnetic lobe, all of which magnetic lobes are located substantially within said sputtering region and which have strengths and orientations such that a null point exists between said upper, lower, inner, and outer magnetic lobes, whereby said upper, lower, inner, and outer magnetic lobes form respective upper, lower, inner, and outer plasma-confining magnetic tunnels.

11. The magnet assembly of claim 10, further comprising:
  a generally plate-shaped magnetically permeable pole piece substantially parallel to the back surface of the target;
  first magnet means having a north-south magnetic orientation that is substantially perpendicular to the back surface of the target;
  second magnet means positioned a spaced distance from said first magnet means and having a north-south magnetic orientation that is substantially perpendicular to the back surface of the target and opposite the magnetic orientation of said first magnet means; and
  third magnet means positioned between said first magnet means and said second magnet means, but closely adjacent said first magnet means and a substantial spaced distance from said second magnet means and having a north-south magnetic orientation that is substantially parallel to the back surface of the target and substantially perpendicular to the respective north-south orientations of said first magnet means and said second magnet means.

12. The magnet assembly of claim 11, including fourth magnet means positioned on said pole piece between said second magnet means and said third magnet means, but closely adjacent said second magnet means and a substantial spaced distance from said third magnet means and having a north-south magnetic orientation that is substantially parallel to the back surface of the target and substantially perpendicular to said north-south orientations of said first magnet means and said second magnet means.

13. The magnet assembly of claim 12, including fifth magnet means positioned on said pole piece between said third magnet means and said fourth magnet means, but closely adjacent said third magnet means and a substantial spaced distance from said fourth magnet means and having a north-south magnetic orientation that is substantially parallel to the back surface of the target and substantially perpendicular to said north-south magnetic orientations of said first magnet means and said second magnet means.

14. The magnet assembly of claim 13, including a first pole piece disposed between said first magnet means and said third magnet means.

15. The magnet assembly of claim 14, including a second pole piece disposed between said fourth magnet means and said second magnet means.

16. The magnet assembly of claim 15, wherein said first pole piece includes a first gap located under said third magnet means and extending partway toward said fourth magnet means.

17. The magnet assembly of claim 16, wherein said second pole piece includes a second gap located under said fourth magnet means and extending partway toward said third magnet means, but not extending to said first gap.

18. The magnet assembly of claim 17, including sixth magnet means positioned on said first magnet means and having a north-south magnetic orientation that is substantially perpendicular to the back surface of the target and substantially aligned with the magnetic orientation of said first magnet means.

19. The magnet assembly of claim 18, wherein said first, second, third, fourth, fifth, and sixth magnet means comprise one or more permanent magnets.

20. The magnet assembly of claim 10, wherein the target is circular and has an axis of symmetry, and wherein said upper, inner, lower, and outer magnetic lobes are concentric with the axis of symmetry of the circular target.

21. The magnet assembly of claim 20, further comprising:
- a circular magnetically permeable base pole piece having an axis of symmetry aligned with the axis of symmetry of the circular target and substantially parallel to the back surface of the target;
- a central magnet mounted to the center of said base pole piece having a north-south magnetic orientation that is substantially perpendicular to the back surface of the target;
- an outer magnet mounted to the outer periphery of said base pole piece, concentric with said central magnet, and having a north-south magnetic orientation that is substantially perpendicular to the back surface of the target and opposite the magnetic orientation of said central magnet; and
- a primary inner magnet positioned between said central magnet and said outer magnet, and concentric therewith, but closely adjacent said central magnet and a substantial spaced distance from said outer magnet, said primary inner magnet having a north-south magnetic orientation that is substantially parallel to the back surface of the target and substantially perpendicular to the respective north-south magnetic orientations of said central magnet and said outer magnet; whereby said central magnet, said outer magnet, and said primary inner magnet produce the magnetic flux lines that comprise the upper, lower, inner, and outer magnetic lobes.

22. The magnet assembly of claim 21, including a secondary outer magnet positioned on said base pole piece between said outer magnet and said primary inner magnet, but closely adjacent said outer magnet and a substantial spaced distance from said primary inner magnet and having a north-south magnetic orientation that is substantially parallel to the back surface of the circular target and substantially perpendicular to said north-south orientations of said central magnet and said outer magnet.

23. The magnet assembly of claim 22, including an outer pole piece disposed between said secondary outer magnet and said outer magnet.

24. The magnet assembly of claim 23, wherein said base pole piece includes an outer gap located under said secondary outer magnet and extending partway toward said primary inner magnet.

25. The magnet assembly of claim 24, including an inner pole piece positioned between said central magnet and said primary inner magnet.

26. The magnet assembly of claim 25, wherein said base pole piece includes an inner gap located under said primary inner magnet and extending towards said outer gap, but not extending to said outer gap.

27. The magnet assembly of claim 26, wherein said inner gap extends to said outer gap.

28. The magnet assembly of claim 21, including an inner pole piece disposed between said central magnet and said primary inner magnet.

29. The magnet assembly of 28, including a booster central magnet positioned on said central magnet and having a north-south magnetic orientation that is substantially aligned with the magnetic orientation of said central magnet.

30. The magnet assembly of claim 29, including an outer pole piece disposed between said secondary outer magnet and said outer magnet.

31. The magnet assembly of claim 30, wherein said base pole piece includes an outer gap located under said secondary outer magnet and extending partway toward said first gap, but not extending to said first gap.

32. The magnet assembly of claim 28, wherein said base pole piece includes an inner gap located under said primary inner magnet and extending partway toward said outer magnet.

33. The magnet assembly of claim 32, including a secondary inner magnet positioned on said base pole piece adjacent said primary inner magnet, between said primary inner magnet and said outer magnet, said secondary inner magnet also being positioned over said inner gap and having a north-south magnetic orientation that is substantially parallel to the back surface of the circular target and substantially perpendicular to said north-south orientations of said central magnet and said outer magnet.

34. The magnet assembly of claim 33, further comprising a secondary outer magnet positioned on said base pole piece between said outer magnet and said secondary inner magnet, but closely adjacent said outer magnet and a substantial spaced distance from said secondary inner magnet and having a north-south magnetic orientation that is substantially parallel to the back surface of the circular target and substantially perpendicular to said north-south orientations of said central magnet and said outer magnet.

35. The magnet assembly of claim 10, wherein the target is rectangular and includes a longitudinal axis and a transverse axis, said magnet assembly including a linear center section and two end sections, said linear center section being aligned with the longitudinal axis of the target, and wherein each said magnetic lobe includes two substantially linear sections disposed in parallel, spaced-apart relation on opposite sides of the longitudinal axis of the rectangular target, respective parallel linear sections of respective magnetic lobes being joined at either end by respective substantially semi-circular end sections; whereby said upper, lower, inner, and outer magnetic lobes form respective upper, lower, inner, and outer oval shaped plasma-confining magnetic tunnels.

36. The magnet assembly of claim 35, further comprising:
- an elongated magnetically permeable base pole piece having an elongated center section and two semi-circular end sections, the elongated center section of said base pole piece being aligned with the longitudinal axis of the rectangular target and substantially parallel to the back surface of the rectangular target;
- a central magnet assembly mounted to the center of said base pole piece, said central magnet assembly including an elongated center magnet that is aligned with the longitudinal axis of the rectangular target, a first cylindrical magnet disposed at one end of said elongated center magnet, and a second cylindrical magnet disposed at the other end of said elongated center magnet, said elongated center magnet and said first and second cylindrical magnets having north-south magnetic orientations that are substantially perpendicular to the back surface of the target;

a plurality of outer magnets mounted to the outer periphery of said base pole piece, each of said outer magnets being substantially equidistant from said central magnet assembly, and wherein each of said outer magnets has a north-south magnetic orientation that is substantially perpendicular to the back surface of the target and opposite the magnetic orientation of said central magnet assembly; and a plurality of primary inner magnets positioned between said central magnet assembly and said outer magnets, but closely adjacent said central magnet assembly and a substantial spaced distance from said outer magnets, each of said primary inner magnets having a north-south magnetic orientation that is substantially parallel to the back surface of the target and substantially perpendicular to the respective north-south orientations of said central magnet assembly and said outer magnets; whereby said central magnet assembly, said outer magnets, and said primary inner magnets produce the magnetic flux lines that comprise the upper, lower, inner, and outer magnetic lobes.

37. The magnet assembly of claim 36, including a plurality of secondary outer magnets positioned on said base pole piece between said outer magnets and said primary inner magnets, but closely adjacent said outer magnets and a substantial spaced distance from said primary inner magnet, each secondary outer magnet having a north-south magnetic orientation that is substantially parallel to the back surface of the rectangular target and substantially perpendicular to said north-south magnetic orientations of said central magnet assembly and said outer magnets.

38. The magnet assembly of claim 37, including an outer pole piece disposed between said secondary outer magnets and said outer magnets.

39. The magnet assembly of claim 38, wherein said base pole piece includes an outer gap located under said secondary outer magnets and extending partway toward said primary inner magnets.

40. The magnet assembly of claim 39, including an inner pole piece positioned between said central magnet assembly and said primary inner magnets.

41. The magnet assembly of claim 40, wherein said base pole piece includes an inner gap located under said primary inner magnets and extending towards said outer gap, but not extending to said outer gap.

42. The magnet assembly of claim 41, wherein said inner gap extends to said outer gap.

43. The magnet assembly of claim 36, including an inner pole piece disposed between said central magnet assembly and said primary inner magnets.

44. The magnet assembly of 43, including a booster central magnet assembly positioned on said central magnet assembly and having a north-south magnetic orientation that is substantially aligned with the magnetic orientation of said central magnet assembly, said booster magnet assembly including an elongated center booster magnet positioned on said elongated center magnet, a first cylindrical booster magnet positioned on said first cylindrical magnet, and a second cylindrical booster magnet positioned on said second cylindrical magnet.

45. The magnet assembly of claim 44, including an outer pole piece disposed between said secondary outer magnets and said outer magnets.

46. The magnet assembly of claim 45, wherein said base pole piece includes an outer gap located under said secondary outer magnets and extending partway toward said first gap, but not extending to said first gap.

47. The magnet assembly of claim 43, wherein said base pole piece includes an inner gap located under said primary inner magnets and extending partway toward said outer magnets.

48. The magnet assembly of claim 47, including a plurality of secondary inner magnets positioned on said base pole piece adjacent said primary inner magnets, between said primary inner magnets and said outer magnets, said secondary inner magnets also being positioned over said inner gap, each said secondary inner magnet having a north-south magnetic orientation that is substantially parallel to the back surface of the rectangular target and substantially perpendicular to said north-south orientations of said central magnet assembly and said outer magnets.

49. The magnet assembly of claim 48, further comprising a plurality of secondary outer magnets positioned on said base pole piece between said outer magnets and said secondary inner magnets, but closely adjacent said outer magnets and a substantial spaced distance from said secondary inner magnets, each secondary outer magnet having a north-south magnetic orientation that is substantially parallel to the back surface of the rectangular target and substantially perpendicular to said north-south magnetic orientations of said central magnet assembly and said outer magnets.

50. Planar magnetron sputtering magnet assembly for sputtering a target, said target having a front surface, a body, and a back surface, said planar magnetron sputtering magnet assembly being positioned adjacent the back surface of the target and generating magnetic flux lines that define a sputtering region adjacent the front surface of the target and within the target body, said magnetic flux lines forming an upper magnetic lobe, a lower magnetic lobe, and inner magnetic lobe, and an outer magnetic lobe, wherein the magnetic flux lines of said upper and lower magnetic lobes have cross-sections characterized by respective upper and lower inflection points with respective upper and lower tangents that are substantially parallel to the back surface of the target, and wherein the magnetic flux lines of said inner and outer magnetic lobes have cross-sections characterized by respective inner and outer inflection points with respective inner and outer tangents that are substantially perpendicular to the back surface of the target, whereby said upper, lower, inner, and outer magnetic lobes form respective upper, lower, inner, and outer plasma-confining magnetic tunnels.

* * * * *